United States Patent
Erickson et al.

(10) Patent No.: US 7,612,427 B2
(45) Date of Patent: Nov. 3, 2009

(54) APPARATUS FOR CONFINING INDUCTIVELY COUPLED SURFACE CURRENTS

(75) Inventors: Sean Christopher Erickson, Fort Collins, CO (US); Jason Dee Hudson, Eaton, CO (US)

(73) Assignee: LSI Corporation, Milpitas, CA (US)

( * ) Notice: Subject to any disclaimer, the term of this patent is extended or adjusted under 35 U.S.C. 154(b) by 71 days.

(21) Appl. No.: 11/856,196

(22) Filed: Sep. 17, 2007

(65) Prior Publication Data

US 2008/0064180 A1  Mar. 13, 2008

Related U.S. Application Data

(63) Continuation of application No. 11/010,970, filed on Dec. 12, 2004, now Pat. No. 7,285,840, and a continuation of application No. 11/248,509, filed on Oct. 12, 2005, now Pat. No. 7,397,105.

(51) Int. Cl.
*H01L 21/04* (2006.01)

(52) U.S. Cl. .................. 257/510; 257/516; 257/647; 438/424; 438/425; 438/427

(58) Field of Classification Search ......... 257/510–512, 257/657; 438/424–428
See application file for complete search history.

(56) References Cited

U.S. PATENT DOCUMENTS

| | | | |
|---|---|---|---|
| 5,936,271 A * | 8/1999 | Alsmeier et al. | ............ 257/301 |
| 7,057,241 B2 | 6/2006 | Ojala | |
| 2004/0195650 A1 | 10/2004 | Yang et al. | |
| 2005/0023639 A1 | 2/2005 | Yeh et al. | |

* cited by examiner

*Primary Examiner*—Dung A. Le
(74) *Attorney, Agent, or Firm*—Yee & Associates, P.C.

(57) ABSTRACT

A deep n-well is formed beneath the area of an inductor coil. The use of a deep n-well lessens the parasitic capacitance by placing a diode in series with the interlayer dielectric cap. The deep n-well also reduces substrate noise. Once the n-well is implanted and annealed, a cross hatch of shallow trench isolation is patterned over the n-well. The shallow trench isolation reduces and confines the inductively coupled surface currents to small areas that are then isolated from the rest of the chip.

9 Claims, 3 Drawing Sheets

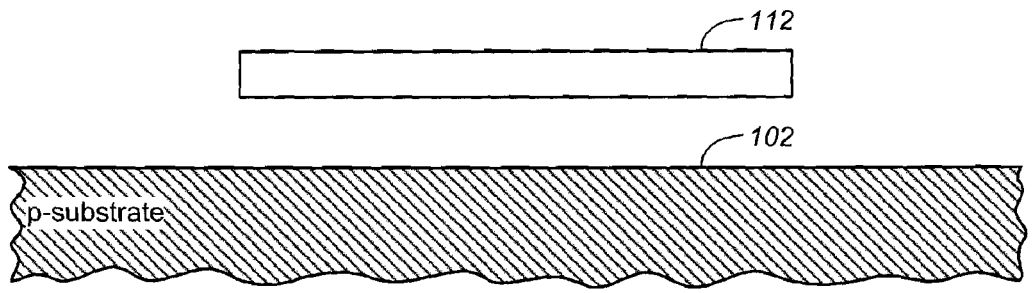
FIG._1
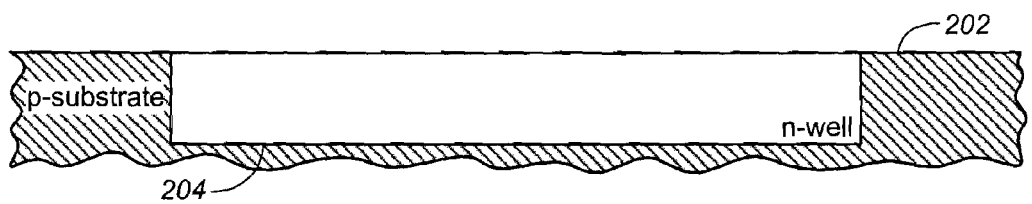
FIG._2A
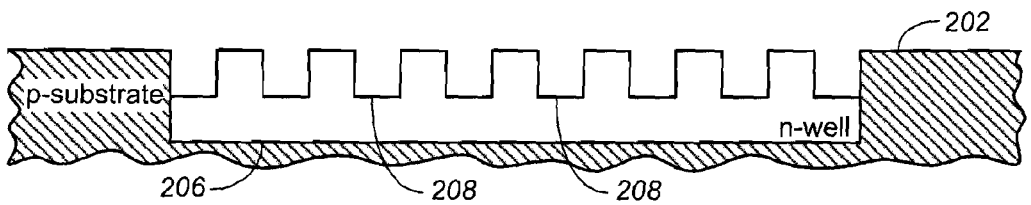
FIG._2B
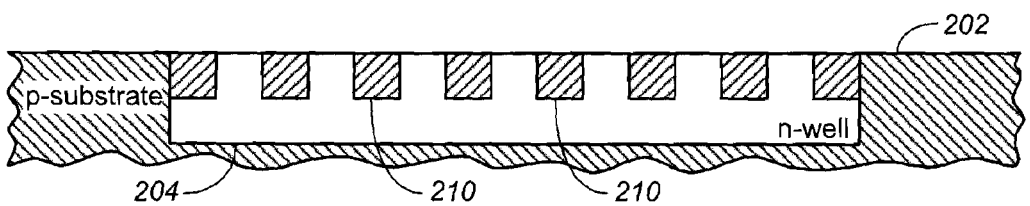
FIG._2C

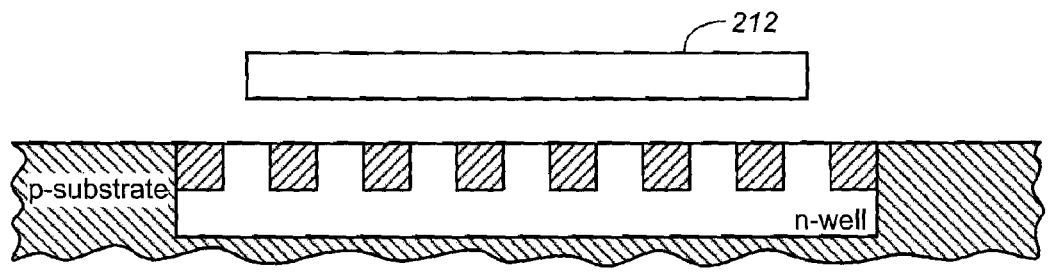
FIG._2D
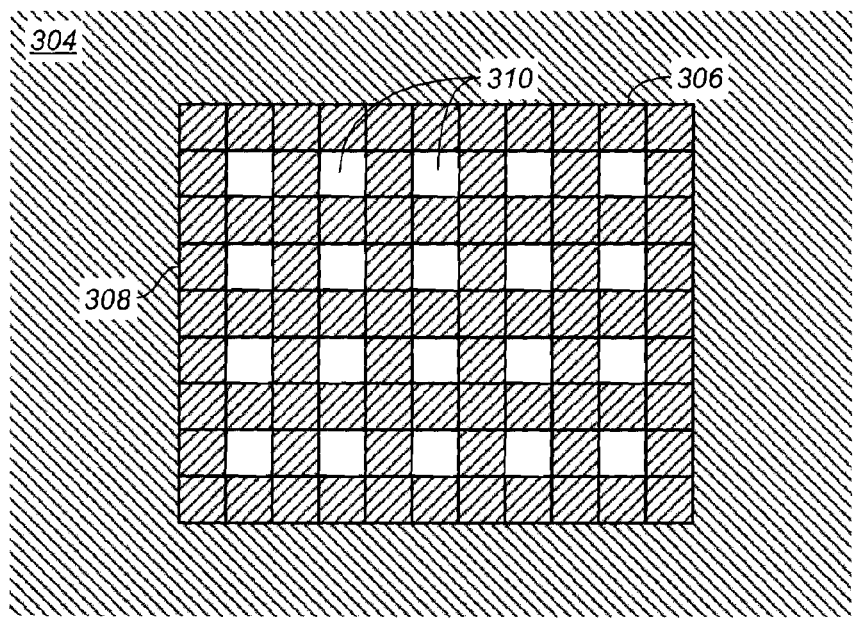
FIG._3

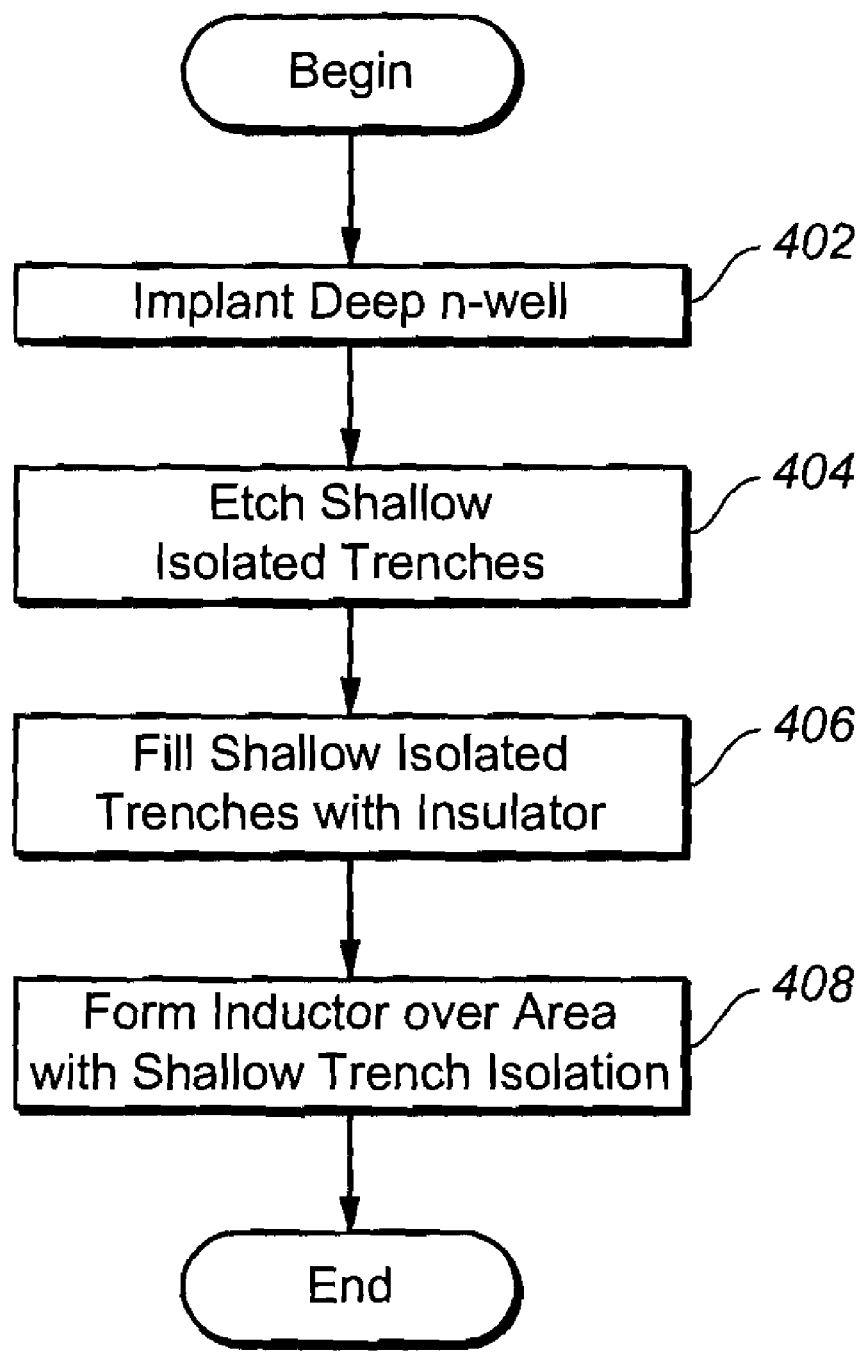
FIG._4

APPARATUS FOR CONFINING INDUCTIVELY COUPLED SURFACE CURRENTS

This application claims priority to and is a continuation of U.S. application Ser. No. 11/010,970, Apparatus for Confining Inductively Coupled Surface Currents, filed Dec. 12, 2004, now U.S. Pat. No. 7,285,840; and also claims priority to and is a continuation of U.S. application Ser. No. 11/248,509, Technique and methodology to passivate inductively or capacitively coupled surface currents under capacitor structures, filed Oct. 12, 2005 now U.S. Pat. No. 7,397,105.

BACKGROUND OF THE INVENTION

1. Technical Field

The present invention is directed generally toward integrated circuit inductors. More particularly, the present invention relates to a method and apparatus for passivating inductively coupled surface currents.

2. Description of the Related Art

Integrated circuit (IC) inductors are inductive coils that are formed above a semiconductor device. IC inductors cause concern with inductively coupled substrate surface currents. Such currents lessen the quality factor (Q) for a device and can cause latch-up and other failures on a chip. The "Q" of a device, in this case, is a measure of how good the inductor is. If surface currents caused by an inductor are detrimental to an IC device, then the "Q" will be unacceptable.

One solution to inductively coupled surface currents is to include floating poly and metal sheets underneath the inductor. The results of floating metal/poly sheets are unknown at this time. Another solution is to use ion implantation and no subsequent annealing over a silicon-on-insulator (SOI) layer to mitigate this effect. SOI is an expensive process and, thus, may be considered disadvantageous for that reason alone.

SUMMARY OF THE INVENTION

The present invention recognizes the disadvantages of the prior art and implants a deep n-well beneath the area of an inductor coil. The use of a deep n-well lessens the parasitic capacitance by placing a diode in series with the interlayer dielectric cap. The deep n-well also reduces substrate noise. Once the n-well is implanted and annealed, a cross hatch of shallow trench isolation is patterned over the n-well. The shallow trench isolation reduces and confines the inductively coupled surface currents to small areas that are then isolated from the rest of the chip.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 illustrates an IC inductor in accordance with an exemplary embodiment of the present invention;

FIGS. 2A-2D depict the fabrication of a semiconductor device with an inductor coil in accordance with an exemplary embodiment of the present invention;

FIG. 3 illustrates a top-down view of a deep n-well with shallow trench isolation, without an inductor, in accordance with an exemplary embodiment of the present invention; and FIG. 4 is a flowchart illustrating a process for fabricating a deep n-well with shallow trench isolation for passivating inductively coupled surface currents in accordance with a preferred embodiment of the present invention.

DETAILED DESCRIPTION

With reference now to the figures, FIG. 1 illustrates an IC inductor in accordance with an exemplary embodiment of the present invention. Inductor coil 112 is formed over p-substrate 102. Substrate 102 may have formed therein or thereon other components not shown. Substrate 102 is a lightly p-doped semiconductor. IC inductor 112 may cause inductively coupled surface currents on substrate 102. Such currents lessen the quality factor (Q) for a device and can cause latch-up and other failures on a chip.

FIGS. 2A-2D depict the fabrication of a semiconductor device with an inductor coil in accordance with an exemplary embodiment of the present invention. More particularly, with reference to FIG. 2A, a deep n-well 204 is implanted into substrate 202. N-well 204 may be implanted through a window in a photoresist mask, for example. The n-well may be formed by a high-energy implant, typically phosphorus as the dopant. The implant dosage is typically on the order of $1 \times 10^{16}$ atoms/cm$^3$. A person of ordinary skill in the art will recognize that other known techniques for forming n-well 204 may also be used. N-well 204 lessens the parasitic capacitance by placing a diode in series with the interlayer dielectric (ILD) cap. The use of a deep n-well is described in further detail in co-pending U.S. patent application Ser. No. 11/005,765, entitled "Reduced Capacitance Resistors," filed Dec. 6, 2004, and herein incorporated by reference. In addition, deep n-well 204 reduces noise on substrate 202.

In an exemplary embodiment of the device, the n-well has a depth of about 0.6 μm and the STI has a typical depth of around 0.4 μm. The depth of the n-well may be within the range of 0.48 μm to 0.72 μm. The depth of the STI may be within the range of 0.32 μm and 0.48 μm. The minimum width of the STI may be about 1.2 μm; however, a typical width may be set arbitrarily. A good practice for setting the width of the STI crosshatch sections would be ¹⁄₁₀ of the length of the inductor coil, such that the surface currents are contained approximately one hundred small pockets. However, the widths of the crosshatch sections may vary depending upon the implementation and on the preferences of the engineer.

Turning to FIG. 2B, once n-well 204 is annealed, a cross hatch of shallow trench isolation (STI) 208 is patterned and etched. The trenches 208 may be formed using known photolithography techniques, for example. Next, with reference to FIG. 2C, the STI is filled with an insulator 210. The STI reduces and confines the inductively coupled surface currents to small areas, which are then isolated from the rest of the chip. Insulator 210 may be, for example, silicon dioxide (SiO$_2$). Finally, with reference to FIG. 2D, inductive coil 212 is formed over the deep n-well and shallow trench isolation.

FIG. 3 illustrates a top-down view of a deep n-well with shallow trench isolation, without an inductor, in accordance with an exemplary embodiment of the present invention. Substrate 304 includes n-well 306. A cross hatch of shallow trench isolation 308 is patterned, etched, and filled with an insulator to form square sections of deep n-well 306 at the surface of substrate 304. Inductively coupled surface currents are confined to small areas, such as areas 310 in FIG. 3. The deep n-well also lessens the parasitic capacitance. The STI crosshatch should extend around the n-well, such that no n-well surface contact exists with the p-type substrate.

FIG. 4 is a flowchart illustrating a process for fabricating a deep n-well with shallow trench isolation for passivating inductively coupled surface currents in accordance with a preferred embodiment of the present invention. The process begins and implants a deep n-well (block 402). Next, the process etches shallow isolated trenches in the deep n-well (block 404) and fills the shallow isolated trenches with insulator (block 406). Thereafter, the process forms an inductor coil over the area with the shallow trench isolation (block 408) and ends.

Thus, the present invention solves the disadvantages of the prior art by providing a deep n-well with shallow trench isolation in the area of an inductive coil. The deep n-well lessens parasitic capacitance and the shallow trench isolation confines inductively coupled surface currents to a small area. As a result, the "Q" for the semiconductor device is increased. The substrate noise is reduced. The technique of the present invention is also inexpensive, requires no extra masks, and uses currently available and standard fabrication processes.

The description of the preferred embodiments of the present invention has been presented for purposes of illustration and description, but is not intended to be exhaustive or limited to the invention in the form disclosed. Many modifications and variations will be apparent to those of ordinary skill in the art. The embodiments were chosen and described in order to best explain the principles of the invention the practical application to enable others of ordinary skill in the art to understand the invention for various embodiments with various modifications as are suited to the particular use contemplated.

What is claimed is:

1. An apparatus, comprising:
   a substrate;
   a deep n-well implanted in the substrate in an area of a capacitor structure; and
   a shallow trench isolation in the deep n-well, wherein the shallow trench isolation includes a crosshatch of insulator material;
   wherein the crosshatch of insulator material extends around the deep n-well, such that no deep n-well contact exists with remaining surface of the substrate.

2. The apparatus of claim 1, wherein the substrate comprises a lightly p-doped semiconductor.

3. The apparatus of claim 2, wherein the deep n-well is formed by implanting the lightly p-doped semiconductor with a dopant.

4. The apparatus of claim 3, wherein the dopant comprises phosphorous.

5. The apparatus of claim 1, wherein a depth of the deep n-well is within a range of 0.48 μm to 0.72 μm.

6. The apparatus of claim 1, wherein a depth of the shallow trench isolation is within a range of 0.32 μm and 0.48 μm.

7. The apparatus of claim 1, wherein the shallow trench isolation forms square sections of deep n-well at the surface of the substrate.

8. The apparatus of claim 1, wherein the insulator material comprises silicon dioxide.

9. An apparatus, comprising:
   a substrate;
   a deep n-well implanted in the substrate in an area of a capacitor structure;
   a shallow trench isolation in the deep n-well, wherein the shallow trench isolation includes a crosshatch of insulator material; and
   wherein the shallow trench isolation forms square sections of deep n-well at the surface of the substrate;
   wherein the crosshatch of insulator material extends around the deep n-well, such that no deep n-well contact exists with remaining surface of the substrate.

* * * * *